United States Patent
Leising

(10) Patent No.: US 9,425,364 B2
(45) Date of Patent: Aug. 23, 2016

(54) METHOD FOR THE PRODUCTION OF WHITE LEDS AND WHITE LED LIGHT SOURCE

(75) Inventor: Günther Leising, Graz (AT)

(73) Assignee: TRIDONIC OPTOELECTRONICS GMBH, Jennersdorf (AT)

( * ) Notice: Subject to any disclaimer, the term of this patent is extended or adjusted under 35 U.S.C. 154(b) by 683 days.

(21) Appl. No.: 13/432,571

(22) Filed: Mar. 28, 2012

(65) Prior Publication Data

US 2012/0187428 A1    Jul. 26, 2012

Related U.S. Application Data

(63) Continuation of application No. 10/586,387, filed as application No. PCT/EP2004/051065 on Jun. 9, 2004, now Pat. No. 8,227,273.

(30) Foreign Application Priority Data

Jun. 18, 2003  (AT) .................................. A 948/2003

(51) Int. Cl.
    *H01L 33/00*    (2010.01)
    *H01L 33/50*    (2010.01)
(52) U.S. Cl.
    CPC ....... *H01L 33/50* (2013.01); *H01L 2933/0041* (2013.01)
(58) Field of Classification Search
    CPC ...................................................... H01L 33/50
    USPC ...................................... 257/88, 98, E33.061
    See application file for complete search history.

(56) References Cited

U.S. PATENT DOCUMENTS

| 5,886,401 A | 3/1999 | Liu ................................ 257/678 |
| 5,959,316 A | 9/1999 | Lowery ........................... 257/98 |

(Continued)

FOREIGN PATENT DOCUMENTS

| DE | 10135306 | 8/2002 | ................ B41J 2/01 |
| EP | 1081771 | 3/2001 | ............. H01L 33/00 |
| JP | 8-335719 | 12/1996 | ............. H01L 33/00 |
| JP | 8-335720 | 12/1996 | ............. H01L 23/29 |
| JP | 10-190065 | 7/1998 | ............. H01L 33/00 |

(Continued)

OTHER PUBLICATIONS

International Search Report, PCT/EP2004/051065, Mar. 17, 2005, 2 pages.

(Continued)

*Primary Examiner* — Robert Huber
(74) *Attorney, Agent, or Firm* — Fitzpatrick, Cella, Harper & Scinto

(57) ABSTRACT

For the production of a white LED having a predetermined color temperature, a blue LED (2a-2d) or a UV LED is coated with a conversion layer (5) which absorbs the blue light or UV light and emits light of greater wavelength. In accordance with the invention, the exact wavelength of the LED (2a-2d) is determined and the color conversion agent (5) is applied over this LED (2a-2d) in a quantity dependent upon the determined wavelength. Through this, the tolerance of the color temperature can be significantly reduced. The color conversion agent may be applied by means of dispenser or stamp, and the quantity and/or concentration selected in dependence upon the determined wavelength. Inkjet printing, deposition from the gas phase or selective removal by means of a laser is, however, also possible. The invention also relates to light sources produced in accordance with this method.

6 Claims, 1 Drawing Sheet

(56) References Cited

U.S. PATENT DOCUMENTS

| | | | |
|---|---|---|---|
| 6,395,564 B1 | 5/2002 | Huang | 438/7 |
| 6,417,019 B1 | 7/2002 | Mueller et al. | 438/29 |
| 6,483,196 B1 | 11/2002 | Wojnarowski et al. | 257/778 |
| 6,590,235 B2 | 7/2003 | Carey et al. | 257/98 |
| 2002/0003233 A1 | 1/2002 | Mueller-Mach et al. | 257/84 |
| 2003/0181122 A1 | 9/2003 | Collins, III et al. | 445/24 |

FOREIGN PATENT DOCUMENTS

| | | | | |
|---|---|---|---|---|
| JP | 2001-244507 | 9/2001 | | H01L 33/00 |
| WO | 00/012226 | 3/2000 | | B41M 3/00 |
| WO | 03/038902 | 5/2003 | | H01L 27/15 |

OTHER PUBLICATIONS

Written Opinion of the International Searching Authority (Translation), PCT/EP2004/051065, Mar. 17, 2005, 4 pages.

METHOD FOR THE PRODUCTION OF WHITE LEDS AND WHITE LED LIGHT SOURCE

This application is a continuation application of U.S. patent application Ser. No. 10/586,387, having a §371(c) date of Oct. 2, 2006, and which is a National Stage of International (PCT) Patent Application No. PCT/EP2004/051065, filed on Jun. 9, 2004, which claims priority from Austrian Patent Application No. A948/2003, filed on Jun. 18, 2003, the entire contents of each of which are incorporated by reference herein in their entirety.

TECHNICAL BACKGROUND

The invention relates to a method for the production of a white light with light emitting diode (=LED) emitting a predetermined color temperature, in the following designated as "white LED", in which an LED emitting blue light, designated in the following as "blue LED", or an LED emitting UV light, designated in the following as "UV LED", is coated with a conversion layer which absorbs the blue light or UV light and emits light of longer wavelength. In the case of a blue LED, a part of the blue emission is converted into a different wavelength region, so that the sum of the emitted light components yields white light. In the case of a UV LED, the conversion layer must naturally contain at least two different color conversion pigments, the emissions of which together yield white light. The invention relates further to a white LED light source, which has a plurality of blue LEDs or UV LEDs, over which a conversion layer is applied.

The color conversion layer is typically of inorganic or organic color conversion pigments, which are distributed in an organic plastic layer.

With regard to a reproducible production of white LEDs within tight tolerances of the resulting chromaticity coordinate, in the production process, along with the concentration of the pigments, also the layer thickness (and its shape) must be exactly defined.

In the state of the art, in this regard various processes are known;

1) The color conversion medium fills the reflector cup, in which the LED is placed, known from
(JP 8335719 A --,,
JP 8335720 A --.);

2) The color conversion medium is applied in drop form over the LED chip (with transparent spacer:
U.S. Pat. No. 5,959,316 A --,,
JP 10190065 A --.);

3) The color conversion medium is applied in the adhesion layer between the LED and a lens (U.S. Pat. No. 6,590,235 B --,);

4) The color conversion medium is definedly produced in layer form and attached to the LED (EP 1081771 A --,);

5) The color conversion layer is directly printed on the LED chip (JP 2001244507 A --,).

These methods meet the requirements for many applications, in particular for illumination, inadequately. The production methods and their tolerances are substantial reasons for the deviations. A further reason is the following:

The excitability of the color conversion agent depends, typically, strongly on the wavelength of the exciting LEDs. Particularly in the case of long wavelength blue LEDs, a wavelength tolerance of only a few nm already leads to significantly different emission intensities with the current color conversion agents. In the case of UV LEDs this would lead primarily to a variation of intensity, in the case of blue LEDs beyond this to a color displacement, since in this case the white light is composed of the blue LED emission and the emission of the color conversion agent.

Since LEDs in accordance with the state of production technology have a relatively broad wavelength distribution, a typical selection class has a wavelength tolerance of more than 5 nm. Even in the case of a very defined application of the color conversion agent (with negligible tolerance) there results from this a tolerance of the color temperature of white LEDs of more than ±300 K. This is already too great for many applications. It thus corresponds to the state of the art, that the market requirement for more narrowly specified white LEDs is satisfied by means of selection processes.

DISCLOSURE OF THE INVENTION

Technical Problem

It is object of the invention to provide a method for the production of white LEDs which have lesser tolerance of color temperature than corresponds to the state of the art. Further, a white LED light source is to be provided which has a lesser broadness of variation of the color temperature, which thus has in particular a virtually constant color temperature over the entire emission surface.

Technical Solution

The object is achieved in accordance with the invention by means of a method of the kind mentioned in the introduction, in that the exact wavelength of the LED is determined before the application of the color conversion agent and then the color conversion agent is applied over this LED in an amount and/or concentration dependent upon the determined wavelength.

This object is further achieved in accordance with the invention by means of a LED light source of the kind mentioned in the introduction, in that the quantity of the conversion layer above each LED depends upon the exact wavelength of the LED concerned.

In contrast to the state of the art, by means of the method in accordance with the invention a production of white LEDs with defined color temperature and defined tolerance is possible, without a further selection procedure being necessary.

The production process can crudely be described as follows:

LEDs are produced in wafers. It corresponds to the state of the art that the individual LEDs on the wafer are measured individually with regard to brightness and wavelength ($\Delta\lambda$<1 nm) (wafer mapping, see production specification of the machine manufacturer, e.g. ASM). This data is then further employed for the following purpose: to select the LEDs, after their separation, into various classes. Alternatively, the optical data of the LEDs can be measured individually, before the application of the color conversion, by means of a spectrometer (or chromameter).

In the subject invention, the information of the wafer mapping is employed to apply to each LED selectively a specific quantity of color conversion agent. The quantity of color conversion agent is hereby selectively, e.g. by means of appropriate selection of the layer thickness or the concentration (in the case of diluted systems) matched to the LED concerned.

In the application of the color conversion agent there are the following possibilities:
  selective dispensing or stamping,
  selective inkjet printing, selective vaporization through masks, selective subsequent setting of the thickness and form of the layer of the color conversion agent (e.g. by means of laser, as in the case of resistance trimming).

For simplification, the LEDs are brought together in groups, e.g. in each case in the range of 1 nm.

BRIEF DESCRIPTION OF THE DRAWINGS

The invention will be explained in more detail with reference to the drawings. There is shown.

Figure 1:
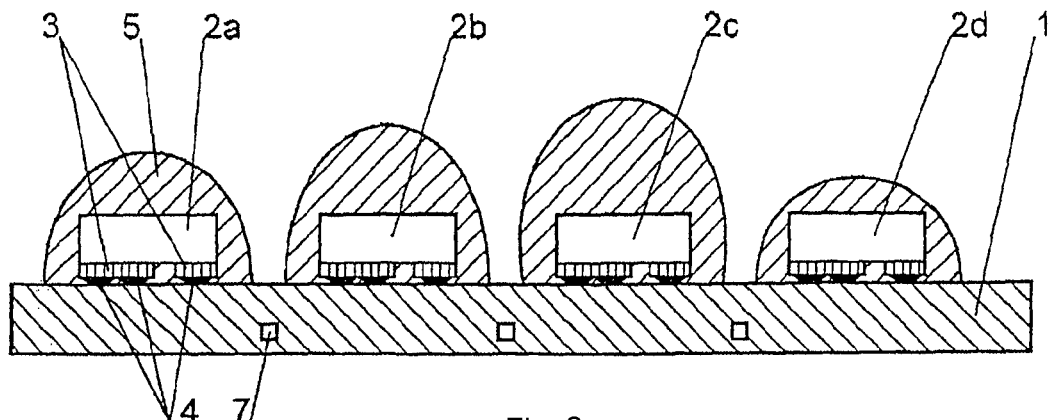
FIG. 1 LEDs with different quantities of binder, in which the color conversion phosphor pigment is located.

There now follow five application examples:

I.) Color Conversion Phosphor Pigment Dispersed in Organic Binder with Constant Concentration—Application by Means of Dispenser In FIG. 1 there is shown a board 1 on which there are located four LED dice 2a, 2b, 2c, 2d. These LED dice 2a, 2b, 2c, 2d are applied in flip-chip technology, i.e. the terminals 3 are located on the underside and are connected with contact bumps 4 with the board 1. Above each LED dice 2a, 2b, 2c, 2d there is located a drop of a binder 5 which contains the color conversion phosphor pigment.

One matches the drop quantity to the wavelength of the LED dice 2a, 2b, 2c, 2d. In accordance with the determined wavelength of the individual LED dice 2a, 2b, 2c, 2d the drop quantity is increased for long wavelength LED dice 2b, 2c, while it is reduced for short wavelength LED dice 2d. Since the viscosity and thixotropy of the paste depends upon the concentration of the color conversion pigment, an alteration of the drop form can be achieved (in the case of a volumetric dosing).

With these methods, by means of a variation of the dispensation volume between 0.02 and 0.03 cm$^3$ on dice, the wavelengths of which vary between 460 and 475 nm, white light with a color temperature of 6500±300 K can be realized.

II.) Color Conversion Pigment Dispersed in Organic Binder with Variable Concentration—Application by Means of Dispenser.

Figure 2:
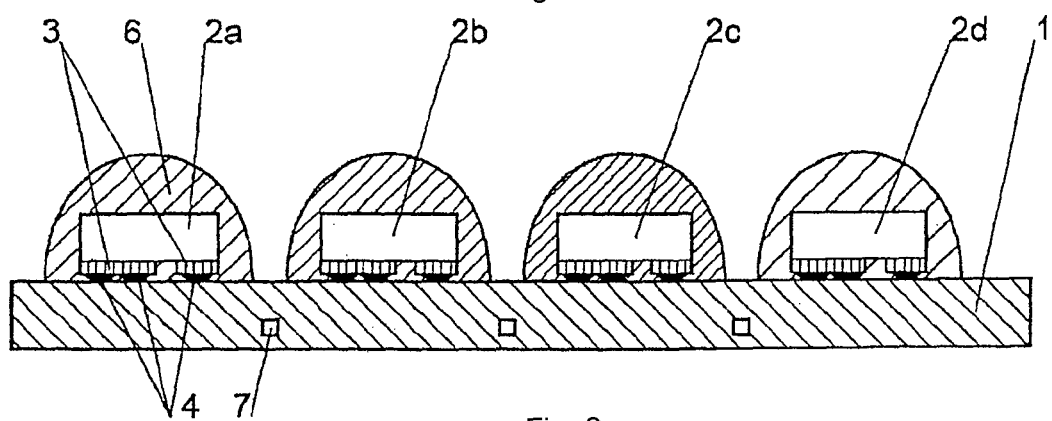
FIG. 2 LEDs with the same quantities of binder, in which the color conversion phosphor pigment is found with different concentration.

The concentration of the phosphor pigment in the binder 6 in the matrix is adapted in accordance with the wavelengths of the individual LED dice 2a, 2b, 2c, 2d (see FIG. 2). This is preferably achieved by means of the employment of a plurality of dispensing or stamp containers with different concentrations of the phosphor pigment. The different concentration is indicated in FIG. 2 by means of hatching with different spacing.

Figure 3:
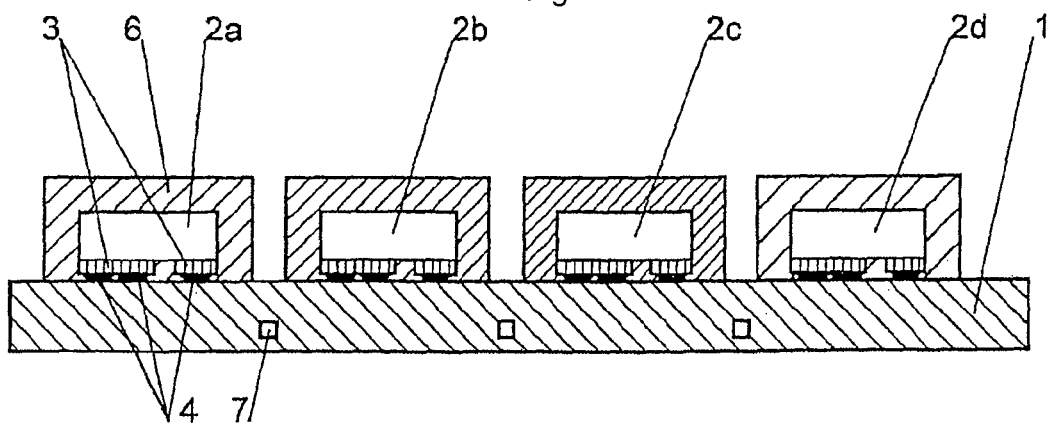
FIG. 3 a modification of the embodiment in accordance with FIG. 2.

Optionally, after the dispensing or stamping procedure, a printing process can follow, in order to achieve a flat and defined form of the color conversion medium (see FIG. 3). For this purpose, a mask is laid over the LED arrangement, in the apertures of which mask the color conversion medium is applied by means of dispenser. Then, by means of a scraper, the material standing above the mask is removed.

With these methods, by means of a variation of the phosphor pigment in the organic matrix between 10 and 30 mass-%, on dice having a wavelength variation between 460 and 475 nm, there can be realized white light having a color temperature of 6500±200 K.

Methods I and II are preferably put to use for LED dice which are arranged face down (electrodes downwardly) on carrier materials (semiconductor carrier or printed circuit board=PCB), since it is difficult in the case of a face up mounting to keep the electrodes free from the color conversion paste. The LEDs so mounted are individually measured with regard to the wavelength in a mapping procedure, and the dispenser programmed with this data. The individual LEDs can then be divided along dividing lines 7 and are processed to LED light sources or also put to use as LED modules.

III.) Color Conversion Phosphor Pigment Dispersed in Organic Binder—Application by Means of Inkjet Printing.

Inkjet printing represents a refinement of the dispensing methods I-II. For this purpose, fine grained pigments (in the region of at the most a few micrometers diameter) are necessary.

The individual setting of the color conversion per LED can be effected by means of the number of applied inkjet drops (=volumetric) or the concentration, by means of the use of different inkjets inks (from different cartridges) or the combination thereof.

IV.) Application of the Color Conversion Materials From the Gas Phase

In accordance with the state of the art there are known some materials (ZnS:Mn) which are suitable for color conversion of light emitted by LEDs and which can be deposited by means of gas phase methods.

One of the advantages of these methods is that electrodes of the LEDs can be selectively covered over and thus this method is also well suited for face up mounted LEDs. (One can simply cover over the contact surfaces.)

The selective color conversion is achieved in this method by means of defined setting of the applied quantity of the color conversion material. This can be effected in the simplest case by the application of a mask (typically a photomask) which is specifically matched to the LED wafer to be coated (in accordance with the wafer mapping data). In this way an LED with the highest wavelength (which normally brings about the best excitability) is fully coated, whilst in the case of LEDs with lesser wavelength only a part of the surface is coated.

V.) Trimming of the Thickness and Form of the Color Conversion Layer

The setting of the color conversion in the case of full-surface applied layers (of the same concentration) can also be effected subsequently. For this purpose there can be applied a method which is put to use in semiconductor and printing technology, in order e.g. to calibrate resistances in a defined manner. For this purpose the coated LED is so trimmed that a laser removes (laser ablation) color conversion material from the surface of the LED in a defined manner so that the desired color is achieved by means of the defined quantity of color conversion material left remaining, independently of the wavelength of the LED.

The invention claimed is:

1. A white LED light source, comprising:
a plurality of blue LEDs or UV LEDs; and
plurality of conversion layers, each one of the layers disposed only above a corresponding of the LEDs, wherein each conversion layer is comprised of only a single layer and not plural sub-layers, and
wherein a particular one of the conversion layers has a thickness, above a particular one of the blue or UV LEDs, which is proportional to a measured wavelength of that particular blue or UV LED, where the thickness of the conversion layer is constructed to be larger for a respective longer measured wavelength and is constructed to be thinner for a respective shorter measured wavelength.

2. A white LED light source according to claim 1, wherein the LEDs of the plurality of blue LEDs or UV LEDs are provided in a face-down arrangement on a carrier material of the LED light source.

3. A white LED light source according to claim 1, wherein the conversion layer comprises a color conversion pigment that is dispersed in organic binder with variable concentration.

4. A white LED light source according to claim 3, wherein the concentration of the color conversion pigment in the binder is adapted in accordance with the measured wavelength of each of the respective blue LEDs or UV LEDs.

5. A white LED light source according to claim 3, wherein a form of a drop of the binder above each of the respective blue LEDs or UV LEDs is adapted to the measured wavelength.

6. A white LED light source according to claim 1, wherein the LED light source emits white light with a color temperature of between 6200K to 6800K.

* * * * *